US012765226B2

(12) United States Patent
Shin

(10) Patent No.: US 12,765,226 B2
(45) Date of Patent: Oct. 13, 2026

(54) DISPLAY APPARATUS

(71) Applicant: Samsung Display Co., Ltd., Yongin-Si (KR)

(72) Inventor: Hyuneok Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 442 days.

(21) Appl. No.: 18/373,278

(22) Filed: Sep. 27, 2023

(65) Prior Publication Data

US 2024/0237481 A1 Jul. 11, 2024

(30) Foreign Application Priority Data

Jan. 6, 2023 (KR) ........................ 10-2023-0002499

(51) Int. Cl.
*H10K 59/80* (2023.01)
*G09G 3/3233* (2016.01)
*H10K 59/122* (2023.01)

(52) U.S. Cl.
CPC ..... *H10K 59/80523* (2023.02); *G09G 3/3233* (2013.01); *H10K 59/122* (2023.02); *G09G 2300/0842* (2013.01)

(58) Field of Classification Search
CPC ................................................ H10K 59/80523
USPC ................................................. 313/498–512
See application file for complete search history.

(56) References Cited

U.S. PATENT DOCUMENTS 7,704,581 B2 4/2010 Takagi et al.
8,426,041 B2 4/2013 Djurovich et al.
2012/0305889 A1* 12/2012 Lim .................... H10H 20/835 257/13
2014/0342104 A1 11/2014 Tauchi et al.

FOREIGN PATENT DOCUMENTS

JP 2006-342416 A 12/2006
JP 2015-035419 A 2/2015
KR 10-0694944 B1 3/2007
KR 10-2016-0066054 A 6/2016

* cited by examiner

*Primary Examiner* — Christopher M Raabe
(74) *Attorney, Agent, or Firm* — Innovation Counsel LLP

(57) ABSTRACT

A display apparatus includes a substrate, and a display element disposed over the substrate, wherein the display element includes a pixel electrode, an emission layer disposed on the pixel electrode, and an opposite electrode covering the emission layer, and wherein the opposite electrode includes a silver (Ag) alloy including Ag, at least one of Group 15 metal elements, and indium (In).

19 Claims, 9 Drawing Sheets

DISPLAY APPARATUS

CROSS-REFERENCE TO RELATED APPLICATION

This application is based on and claims priority under 35 U.S.C. § 119 to Korean Patent Application No. 10-2023-0002499, filed on Jan. 6, 2023, in the Korean Intellectual Property Office, the disclosure of which is incorporated by reference herein in its entirety.

BACKGROUND

1. Field

One or more embodiments relate to a display apparatus.

2. Description of the Related Art

A display apparatus visually displays images. The display apparatus may include a substrate including a display area and a peripheral area. A scan line is insulated from a data line in the display area and a plurality of pixels may be arranged in the display area. In addition, a thin-film transistor and a sub-pixel electrode electrically connected to the thin-film transistor may be provided in the display area, wherein each of the thin-film transistor and the sub-pixel electrode corresponds to each of the pixels. In addition, an opposite electrode may be provided in the display area, wherein the opposite electrode is provided in common to the pixels. Various wirings, a scan driver, a data driver, a controller, a pad portion, and the like configured to transfer electrical signals to the display area may be provided in the peripheral area.

The usage of display apparatuses has diversified. Accordingly, various attempts have been made to designs to improve quality of display apparatuses.

SUMMARY

One or more embodiments include a display apparatus with improved resolution, capable of implementing excellent image quality. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate, and a display element disposed over the substrate, wherein the display element includes a pixel electrode, an emission layer disposed on the pixel electrode, and an opposite electrode covering the emission layer, and wherein the opposite electrode includes a silver (Ag) alloy including Ag, at least one of Group 15 metal elements, and indium (In).

Ag content included in the opposite electrode may be 99 at % or more.

The Group 15 metal element included in the opposite electrode may be bismuth (Bi) or antimony (Sb).

A total content of the Group 15 metal elements included in the Ag alloy may be from about 0.25 at % to about 0.75 at %.

The opposite electrode may further include zinc (Zn).

A total content of indium (In) and zinc (Zn) included in the Ag alloy may be from about 0.25 at % to about 0.75 at %.

The opposite electrode may include a first layer and a second layer disposed on the first layer, wherein the second layer may include the Ag alloy.

The first layer may include at least one of ytterbium (Yb), scandium (Sc), vanadium (V), yttrium (Y), indium (In), cerium (Ce), samarium (Sm), europium (Eu), and terbium (Tb).

A thickness of the second layer may be from about 50 Å to about 200 Å.

A thickness of the first layer may be from about 5 Å to about 30 Å.

A resistivity of the opposite electrode may be 7 μΩcm or less.

According to one or more embodiments, a display apparatus includes a substrate, and a display element disposed over the substrate, wherein the display element includes a pixel electrode, a pixel-defining layer including an opening exposing at least a portion of the pixel electrode, and an opposite electrode disposed on the pixel electrode and the pixel-defining layer, wherein the opposite electrode includes a first layer and a second layer disposed on the first layer, and wherein the second layer includes a silver (Ag) alloy including Ag, at least one of Group 15 metal elements, indium (In), and zinc (Zn), an Ag content in the Ag alloy being 99 at % or more.

The Group 15 metal element included in the second layer may be bismuth (Bi) or antimony (Sb).

A total content of the Group 15 metal elements included in the second layer may be from about 0.25 at % to about 0.75 at %.

A total content of indium (In) and zinc (Zn) included in the second layer may be from about 0.25 at % to about 0.75 at %.

A resistivity of the second layer may be 7 μΩcm or less.

A thickness of the first layer may be from about 5 Å to 30 Å, and a thickness of the second layer may be from about 50 Å to 200 Å.

The first layer may include at least one of ytterbium (Yb), scandium (Sc), vanadium (V), yttrium (Y), indium (In), cerium (Ce), samarium (Sm), europium (Eu), and terbium (Tb).

The display apparatus may further include an emission layer disposed between the pixel electrode and the opposite electrode, wherein the emission layer may be disposed in the opening of the pixel-defining layer.

The display apparatus may further include a thin-film encapsulation layer disposed on the opposite electrode and including at least one inorganic encapsulation layer and at least one organic encapsulation layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
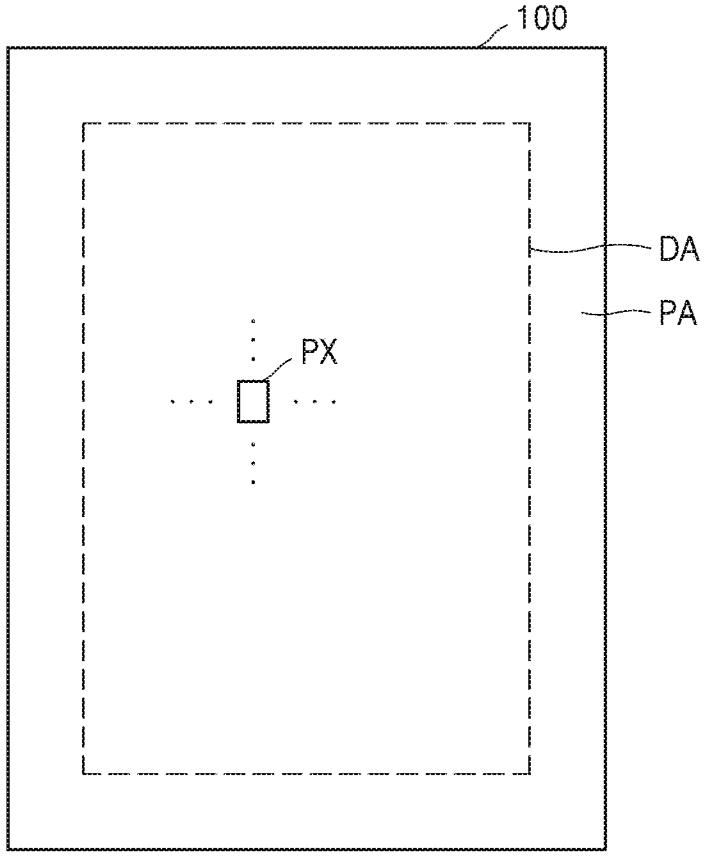
FIG. 1 is a schematic plan view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While terms such as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or elements but do not preclude the addition of one or more other features or elements.

It will be further understood that, when a layer, region, or element is referred to as being "on" another layer, region, or element, it can be directly or indirectly on the other layer, region, or element. That is, for example, intervening layers, regions, or elements may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

It will be understood that when a layer, region, or element is referred to as being "connected" to another layer, region, or element, it may be "directly connected" to the other layer, region, or element or may be "indirectly connected" to the other layer, region, or element with another layer, region, or element located therebetween. For example, it will be understood that when a layer, region, or element is referred to as being "electrically connected" to another layer, region, or element, it may be "directly electrically connected" to the other layer, region, or element or may be "indirectly electrically connected" to the other layer, region, or element with another layer, region, or element interposed therebetween.

FIG. 1 is a schematic plan view of a display apparatus according to an embodiment.

The display apparatus displays images and may be a mobile apparatus such as a game console, a multimedia apparatus, and an ultraminiature personal computer (PC) which is a portable electronic equipment. The display apparatus may include liquid crystal displays, electrophoretic displays, organic light-emitting displays, inorganic light-emitting displays, field emission displays, surface-conduction electron-emitter displays, quantum dot displays, plasma displays, cathode ray displays, and the like. Hereinafter, although an organic light-emitting display apparatus is described as an example of the display apparatus according to an embodiment, the various types of display apparatus described above may be used in embodiments.

As shown in FIG. 1, the display apparatus may include a display area DA and a peripheral area PA, wherein a plurality of pixels PX are arranged in the display area DA, and the peripheral area PA is outside the display area DA. Specifically, the peripheral area PA may surround the display area DA entirely. This may be understood that a substrate 100 included in the display apparatus has the display area DA and the peripheral area PA.

Each pixel PX of the display apparatus is a region that may emit light of a preset color. The display apparatus may be configured to display images using light emitted from the pixels PX. As an example, each pixel PX may be configured to emit red light, green light, or blue light. The pixel PX may further include a plurality of thin-film transistors and a storage capacitor configured to control a display element. The number of thin-film transistors included in one pixel may be one to seven. However, various modifications may be made.

As shown in FIG. 1, the display area DA may have a polygonal shape including a quadrangular shape. As an example, the display area DA may have a rectangular shape in which a horizontal length thereof is greater than a vertical length, a rectangular shape in which a horizontal length thereof is less than a vertical length, or a square shape. Alternatively, the display area DA may have various shapes such as an elliptical shape or a circular shape.

The peripheral area PA may be a non-display area in which the pixels PX are not arranged. A driver and the like configured to provide electric signals or power to the pixels PX may be arranged in the peripheral area PA. Pads (not shown) may be arranged in the peripheral area PA, wherein various kinds of electronic elements or a printed circuit board may be electrically connected to the pads. The pads may be spaced apart from each other in the peripheral area PA and electrically connected to a printed circuit board or an integrated circuit element. A thin-film transistor may be also provided in the peripheral area PA. In this case, the thin-film transistor arranged in the peripheral area PA may be a portion of a circuit portion configured to control electrical signals applied to the pixels disposed in the display area DA.

Figure 2:
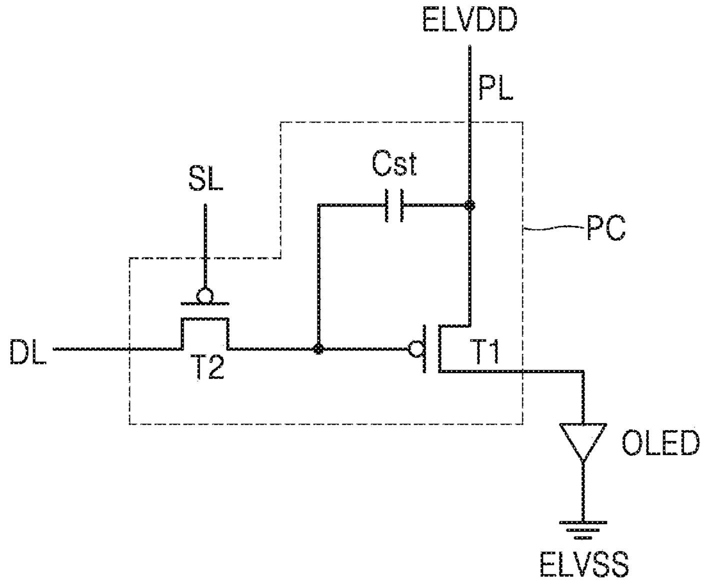
FIG. 2 is an equivalent circuit diagram of a pixel included in the display apparatus of FIG. 1.

FIG. 2 is an equivalent circuit diagram of a pixel PX included in the display apparatus of FIG. 1. As shown in FIG. 2, a pixel PX may include a pixel circuit PC and an organic light-emitting diode OLED electrically connected to the pixel circuit PC.

The pixel circuit PC may include a first thin-film transistor T1, a second thin-film transistor T2, and a storage capacitor Cst. The second thin-film transistor T2 is a switching thin-film transistor, may be connected to a scan line SL and a data line DL, and may be configured to be turned on in response to a switching signal and transfer a data signal to the first thin-film transistor T1, the data signal being input from the data line DL, and the switching signal being input from the scan line SL. The storage capacitor Cst includes one end electrically connected to the second thin-film transistor T2, and another end electrically connected to a driving voltage line PL. The storage capacitor Cst may be configured to store a voltage corresponding to a difference between a data voltage transferred from the second thin-film transistor T2 and a driving power voltage ELVDD supplied from the driving voltage line PL.

The first thin-film transistor T1 is a driving transistor, may be connected to the driving voltage line PL and the storage capacitor Cst, and may be configured to control the magnitude of a driving current according to the voltage stored in the storage capacitor Cst, the driving current flowing from the driving voltage line PL to the organic light-emitting diode OLED. The organic light-emitting diode OLED may be configured to emit light having a preset brightness corresponding to the driving current. An opposite electrode of the organic light-emitting diode OLED may be configured to receive an electrode power voltage ELVSS.

Although it is described with reference to FIG. 2 that the pixel circuit PC includes two transistors and one storage capacitor, the embodiment is not limited thereto. As an example, the number of transistors and the number of storage capacitors may vary according to the design of the pixel circuit PC.

Figure 3:
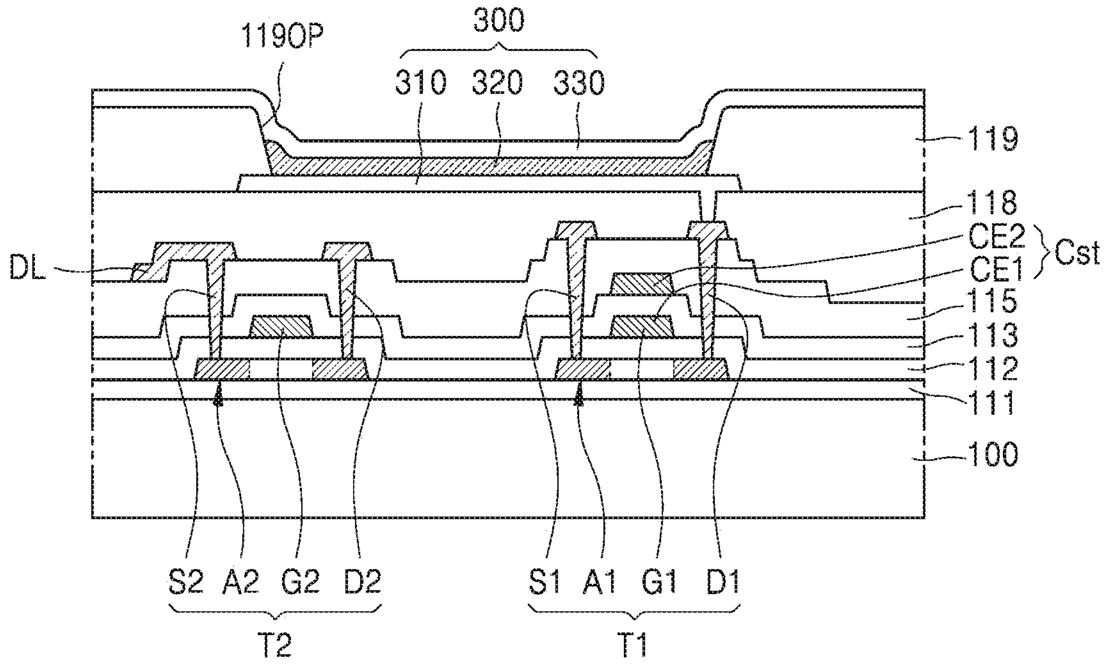
FIG. 3 is a schematic cross-sectional view of the display apparatus according to an embodiment.

FIG. 3 is a schematic cross-sectional view of the display apparatus according to an embodiment.

Referring to FIG. 3, the display apparatus includes a substrate 100, the first and second thin-film transistors T1 and T2, and an organic light-emitting diode 300, wherein the first and second thin-film transistors T1 and T2 are disposed on the substrate 100, and the organic light-emitting diode 300 is a display element and is electrically connected to the first and second thin-film transistors T1 and T2. In addition, an organic light-emitting apparatus may further include various insulating layers 111, 112, 113, 115, 118, and 119, and the storage capacitor Cst.

The substrate 100 may include various materials such as glass, metal, plastic or the like. In an embodiment, in the case where the substrate 100 is flexible, the substrate 100 may include a polymer resin including polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

A buffer layer 111 may be disposed on the substrate 100, may reduce or block penetration of foreign materials, moisture, or external air from below the substrate 100, and may provide a flat surface on the substrate 100. The buffer layer 111 may include an inorganic material, an organic material, or an organic/inorganic composite material, and include a single layer or a multi-layer including an inorganic material and an organic material, the inorganic material including oxide or nitride. A barrier layer (not shown) may be further disposed between the substrate 100 and the buffer layer 111, the barrier layer blocking penetration of external air. As an example, the buffer layer 111 may include silicon oxide ($SiO_2$) or silicon nitride ($SiN_x$).

The first thin-film transistor T1 and/or the second thin-film transistor T2 may be disposed on the buffer layer 111. The first thin-film transistor T1 includes a semiconductor layer A1, a gate electrode G1, a source electrode S1, and a drain electrode D1. The second thin-film transistor T2 includes a semiconductor layer A2, a gate electrode G2, a source electrode S2, and a drain electrode D2. The first thin-film transistor T1 may be connected to the organic light-emitting diode 300 to serve as a driving thin-film transistor configured to drive the organic light-emitting diode 300. The second thin-film transistor T2 may be connected to the data line DL to serve as a switching thin-film transistor. Although two thin-film transistors are shown in the drawing, the embodiment is not limited thereto. The number of thin-film transistors may be variously modified such as 1 to 7.

The semiconductor layers A1 and A2 may include amorphous silicon or polycrystalline silicon. In another embodiment, the semiconductor layers A1 and A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layers A1 and A2 may include a channel region, a source region, and a drain region, the source region and the drain region being doped with impurities.

The gate electrodes G1 and G2 are disposed over the semiconductor layers A1 and A2 with the first gate insulating layer 112 disposed therebetween. The gate electrodes G1 and G2 may include at least one of molybdenum (Mo), aluminum (Al), copper (Cu), titanium (Ti) and the like and include a single layer or a multi-layer. As an example, the gate electrodes G1 and G2 may include a single Mo layer.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may be provided to cover the gate electrodes G1 and G2. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A first storage electrode CE1 of the storage capacitor Cst may overlap the first thin-film transistor T1. As an example, the gate electrode G1 of the first thin-film transistor T1 may serve as the first storage electrode CE1 of the storage capacitor Cst. However, the embodiment is not limited thereto. The storage capacitor Cst may not overlap the first thin-film transistor T1 but may be apart from the first and second thin-film transistors T1 and T2.

A second storage electrode CE2 of the storage capacitor Cst may overlap the first storage electrode CE1 with the second gate insulating layer 113 interposed therebetween. In this case, the second gate insulating layer 113 may serve as a dielectric layer of the storage capacitor Cst. The second storage electrode CE2 may include a conductive material including molybdenum (Mo), aluminum (Al), copper (Cu), and titanium (Ti) and have a single-layered structure or a multi-layered structure including the above materials. As an example, the second storage electrode CE2 may be a single Mo layer or a multi-layer of Mo/Al/Mo.

The interlayer insulating layer 115 is formed on the entire surface of the substrate 100 to cover the second storage electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The source electrodes S1 and S2 and the drain electrodes D1 and D2 are disposed on the interlayer insulating layer 115. The source electrodes S1 and S2 and the drain electrodes D1 and D2 may each include a conductive material including molybdenum (Mo), aluminum (Al), copper (Cu), and titanium (Ti) and include a single layer or a multi-layer including the above materials. As an example, the source electrodes S1 and S2 and the drain electrodes D1 and D2 may have a multi-layered structure of Ti/Al/Ti.

A planarization layer 118 may be disposed on the source electrodes S1 and S2 and the drain electrodes D1 and D2, and the organic light-emitting diode 300 may be disposed on the planarization layer 118. The organic light-emitting element 300 includes a pixel electrode 310, an intermediate layer 320, and an opposite electrode 330, wherein the intermediate layer 320 includes an emission layer.

The planarization layer 118 may have a flat upper surface such that the pixel electrode 310 disposed on the planarization layer 118 may be formed flat. The planarization layer 118 may include a single layer or a multi-layer including an organic material and/or an inorganic material. The planarization layer 118 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 118 may include a inorganic insulating layer such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). To planarize the planarization layer 118 including the inorganic insulating layer, chemical mechanical polishing may be performed to provide a flat upper surface after the planarization layer 118 is formed.

There is an opening (a contact hole) in the planarization layer 118 that exposes one of the source electrode S1 and the drain electrode D1 of the first thin-film transistor T1. The pixel electrode 310 is electrically connected to the first thin-film transistor T1 by contacting the source electrode S1 or the drain electrode D1 through the opening.

The pixel electrode 310 includes a light-transmissive conductive layer and/or a reflective layer, wherein the light-transmissive conductive layer includes a light-transmissive conductive oxide such as indium tin oxide (ITO), indium oxide ($In_2O_3$), or indium zinc oxide (IZO), and the reflective layer includes metal such as aluminum (Al) or silver (Ag). As an example, the pixel electrode 310 may have a three-layered structure of ITO/Ag/ITO.

A pixel-defining layer 119 may be disposed on the pixel electrode 310. The pixel-defining layer 119 defines a light emitting area by forming an opening 119OP corresponding to each sub-pixel, that is, the opening 119OP exposing at least a central portion of the pixel electrode 310. In addition, the pixel-defining layer 119 may prevent arcs and the like from occurring at the edges of the pixel electrode 310 by increasing a distance between the pixel electrode 310 and the opposite electrode 330. The pixel-defining layer 119 may include, for example, an organic material such as polyimide or hexamethyldisiloxane (HMDSO).

A spacer (not shown) may be disposed on the pixel-defining layer 119. The spacer may be intended to prevent mask chopping that may occur during a mask process required for forming the intermediate layer 320 of the organic light-emitting diode 300. The spacer may include an organic material such as polyimide or hexamethyldisiloxane (HMDSO). The spacer may include the same material as a material forming the pixel-defining layer 119 and be simultaneously formed with the pixel-defining layer 119. In this case, a half-tone mask may be used.

The intermediate layer 320 of the organic light-emitting diode 300 may include an emission layer. The emission layer may include an organic material including a fluorescent or phosphorous material configured to emit red, green, blue, or white light. Green light may be light having a wavelength band from about 495 nm to about 580 nm, red light may be light having a wavelength band from about 580 nm to about 780 nm, and blue light may be light having a wavelength band from about 400 nm to about 495 nm.

The emission layer may include a polymer organic material or a low molecular weight organic material. Functional layers may be further arranged under and over the emission layer, the functional layers including a hole transport layer (HTL), a hole injection layer (HIL), an electron transport layer (ETL), and an electron injection layer (EIL). The intermediate layer 320 may be disposed to correspond to each of the plurality of pixel electrodes 310. However, the embodiment is not limited thereto. The intermediate layer 320 may include a layer that is one body over the plurality of pixel electrodes 310. However, various modifications may be made.

The opposite electrode 330 may be arranged over the display area DA and the peripheral area PA, and disposed on the intermediate layer 320 and the pixel-defining layer 119. The opposite electrode 330 may be formed as one body over the plurality of organic light-emitting diodes to correspond to the plurality of pixel electrodes 310.

The opposite electrode 330 may include a conductive material having a low work function. In an embodiment, the opposite electrode 330 may include an Ag alloy. Specifically, the opposite electrode 330 may include Ag, at least one of Group 15 metal elements, and indium (In). In this case, the Group 15 metal element included in the opposite electrode 330 may be bismuth (Bi) and/or antimony (Sb). The opposite electrode 330 may further include zinc (Zn). For example, the opposite electrode 330 may include an Ag alloy including silver (Ag), bismuth (Bi), indium (In), and zinc (Zn).

Figure 4:
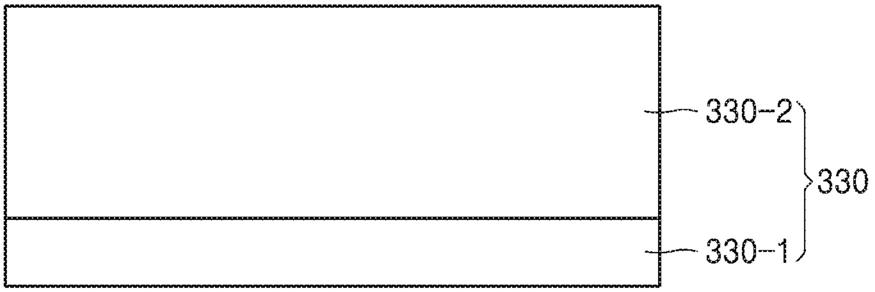
FIG. 4 is a schematic cross-sectional view of an opposite electrode of the display apparatus according to an embodiment.

FIG. 4 is a schematic cross-sectional view of the opposite electrode 330 of the display apparatus according to an embodiment. FIGS. 5A to 6C are views for explaining the opposite electrode 330 of the display apparatus according to another embodiment.

Referring to FIG. 4, the opposite electrode 330 may include a double-layered structure. The opposite electrode 330 may include a first layer 330-1 and a second layer 330-2 disposed on the first layer 330-1.

The first layer 330-1 of the opposite electrode 330 may include metal having a low work function. Specifically, the first layer 330-1 may include at least one of ytterbium (Yb), scandium (Sc), vanadium (V), yttrium (Y), indium (In), cerium (Ce), samarium (Sm), europium (Eu), and terbium (Tb). In an embodiment, the first layer 330-1 of the opposite electrode 330 may include ytterbium (Yb). The first layer 330-1 may serve as an electron injection layer. In the case where the first layer 330-1 includes metal having a low work function such as ytterbium (Yb), an electron injection barrier of the organic light-emitting diode 300 may be reduced, and simultaneously, a light-emission efficiency may be improved.

The first layer 330-1 of the opposite electrode 330 may be formed to have a thin thickness of about 5 Å to 30 Å. The thickness of the second layer 330-2 of the opposite electrode 330 may be about 50 Å to 200 Å.

The second layer 330-2 of the opposite electrode 330 may include an Ag alloy. The Ag alloy may include Ag, at least one of Group 15 metal elements, In, and Zn. In this case, the Group 15 metal element may be bismuth (Bi) and/or antimony (Sb). The second layer 330-2 of the opposite electrode 330 is not limited to the above elements but may further include an element different from the above elements.

In the case where the second layer 330-2 includes an Ag alloy including a Group 15 metal element (Bi and/or Sb) and In, agglomeration of Ag is prevented. Accordingly, surface flatness may be excellent as compared to the case where an Ag alloy includes only pure Ag or In. That is, because the opposite electrode 330 according to an embodiment includes alloy elements preventing agglomeration of Ag together with Ag, a continuous layer having uniform thickness may be formed.

The opposite electrode 330 may be formed by a sputtering process. Unlike the embodiments, in the case where the opposite electrode includes a silver-magnesium (AgMg) alloy, it may be difficult to manufacture a sputtering target due to oxidation characteristics of magnesium (Mg). In an embodiment, because the opposite electrode 330 includes the Group 15 metal element, it may be easy to manufacture a sputtering target.

A total content of the Group 15 metal elements included in the Ag alloy may be 0.25 atomic % (at %) or more. For example, a total content of the Group 15 metal elements included in the Ag alloy may be from about 0.25 at % to about 0.75 at %. That is, a total content of Bi and/or Sb may be 0.25 at % or more. A total content of In and/or Zn included in the Ag alloy may be 0.25 at % or more. For example, a total content of the Bi and/or Sb included in the Ag alloy may be from about 0.25 at % to about 0.75 at %. Accordingly, the second layer 330-2 may be configured to maintain excellent surface flatness.

However, content of Ag may be 99 at % or more. That is, content of elements other than Ag may be 1 at % or less in total. In the case where content of a material other than Ag in the Ag alloy of the second layer 330-2 increases, the surface flatness of the second layer 330-2 may become excellent but a resistance may increase. According to an embodiment, an increase in the resistance of the second layer 330-2 may be prevented by maintaining the total content of elements other than Ag in the Ag alloy be 1 at % or less.

Unlike the embodiments, in the case where the opposite electrode includes an AgMg alloy, a resistivity of the opposite electrode may be 12 μΩcm or more. In contrast, a resistivity of the second layer 330-2 of the opposite electrode 330 according to an embodiment may be 7 μΩcm or less.

Figure 5A:
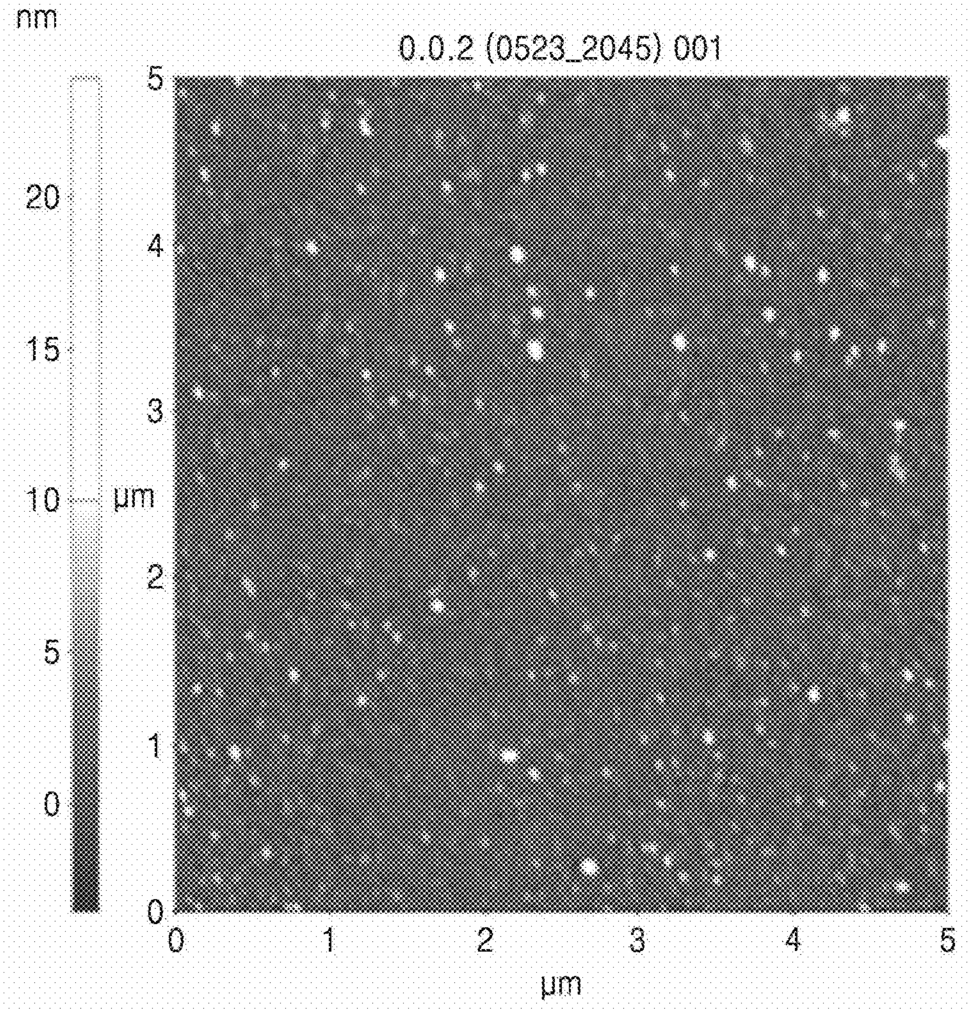
FIGS. 5A, 5B and 5C are views of a comparative example, for explaining an opposite electrode of a display apparatus according to an embodiment.
Figure 5B:
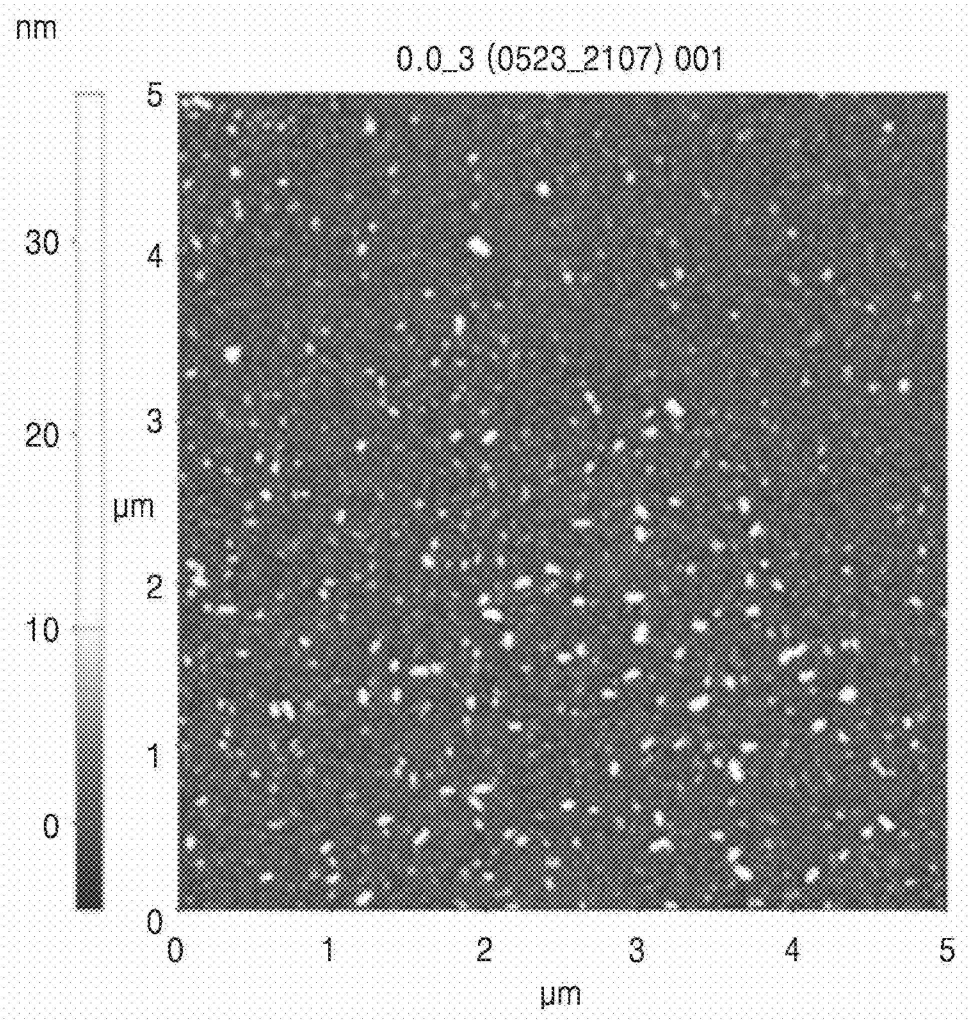
Figure 5C:
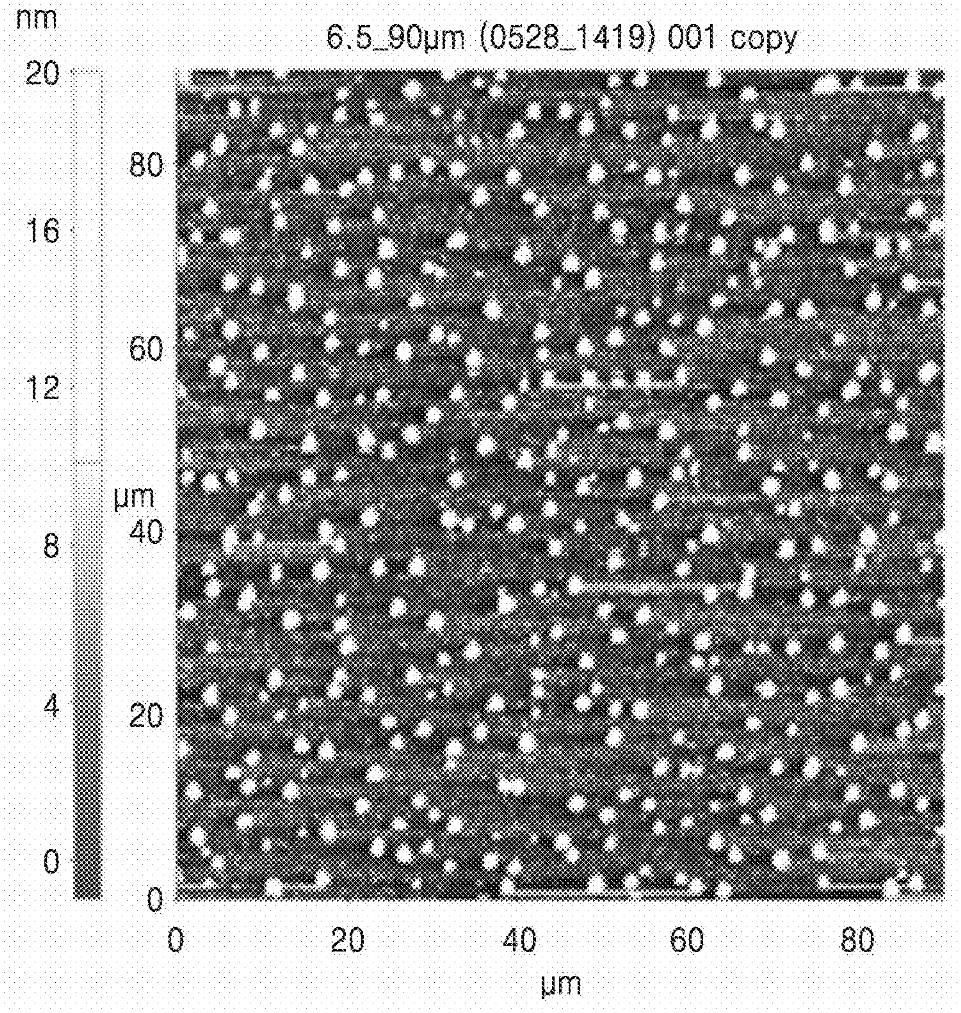

FIGS. 5A to 5C are comparative samples which show atomic force microscope (AFM) images of the surface of a sample including an alloy including Ag and In. The content of In may be about 0.5 at %. FIG. 5A is an image before the comparative sample is exposed to hydrogen sulfide gas ($H_2S$), and FIG. 5B is an image after the comparative sample is exposed to hydrogen sulfide gas ($H_2S$). FIG. 5C is an image after the comparative sample is heat-treated.

Figure 6A:
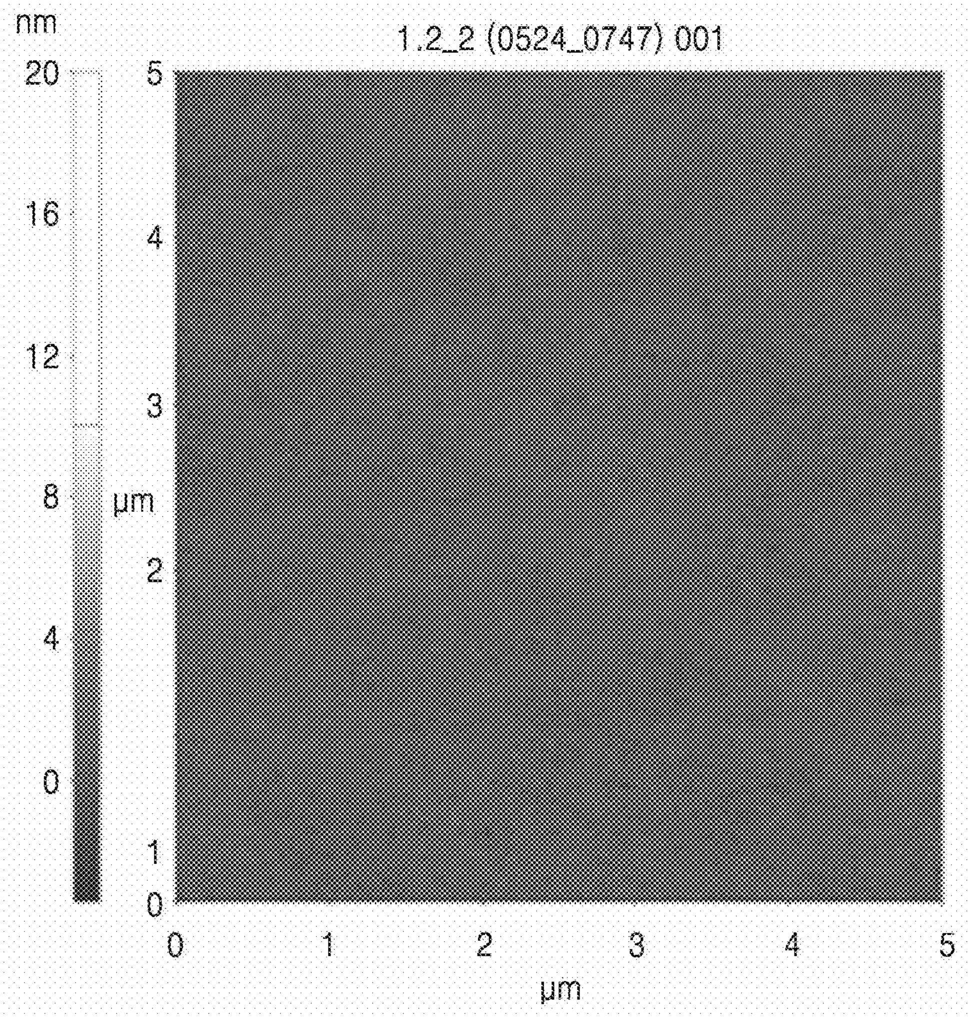
FIGS. 6A, 6B and 6C are views for explaining an opposite electrode of the display apparatus according to another embodiment.
Figure 6B:
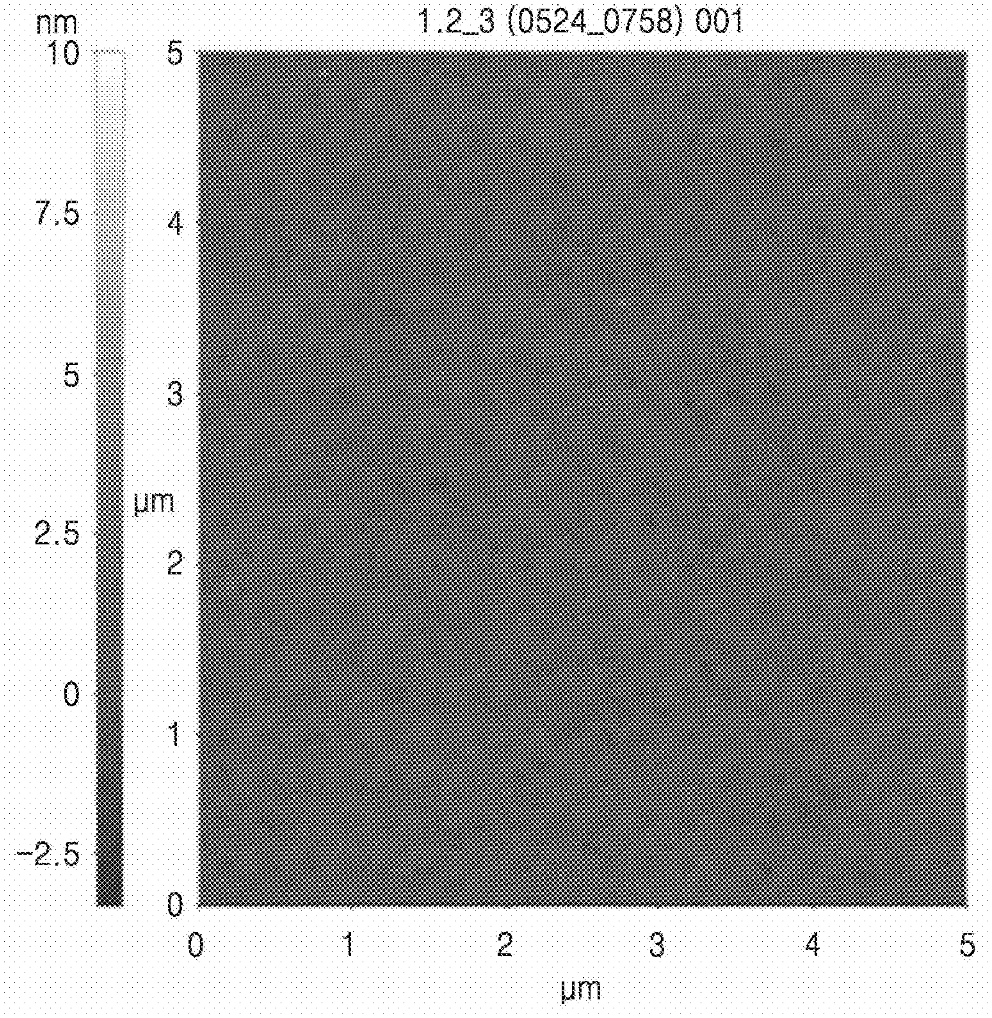
Figure 6C:
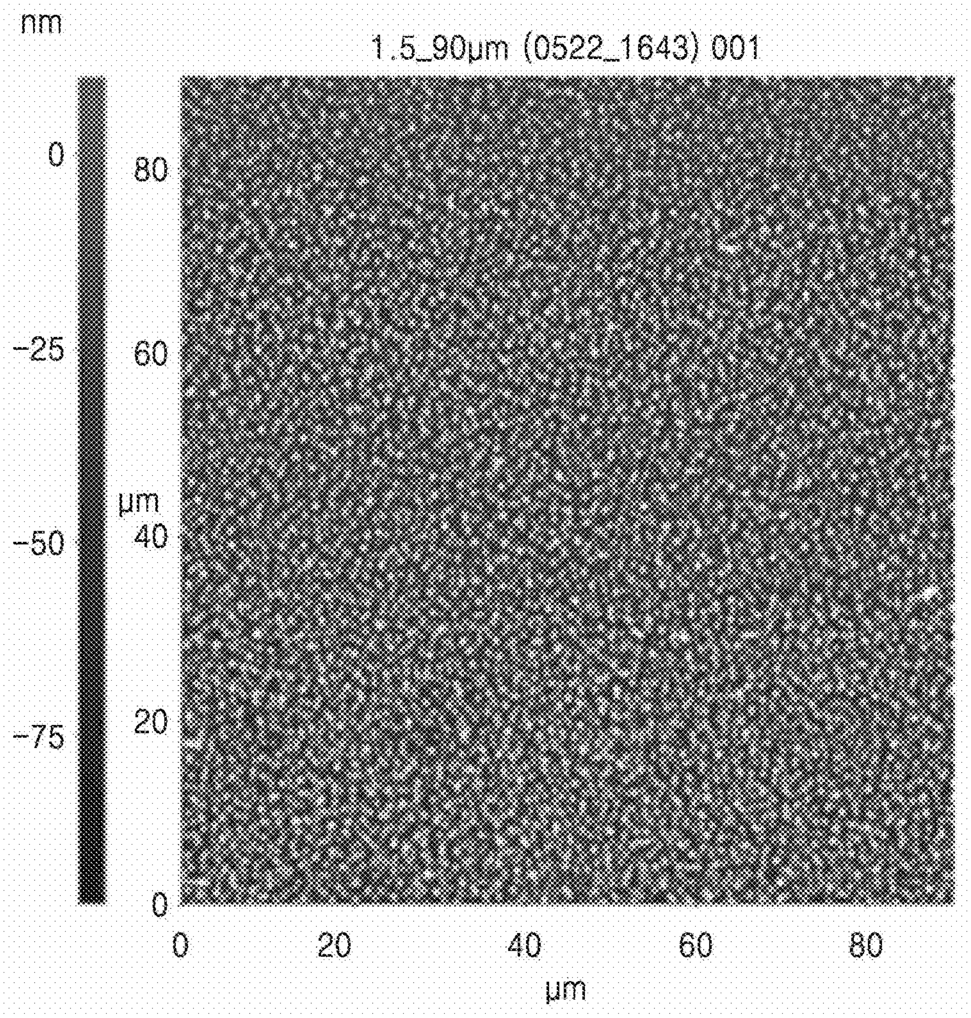

FIGS. 6A to 6C are samples according to an embodiment which show atomic force microscope (AFM) images of the surface of the sample including an alloy including Ag, a Group 15 metal element, In, and Zn. The content of the Group 15 metal element is about 0.25 at %, and the total content of In and Zn is about 0.25 at %. FIG. 6A is an image before the sample of an embodiment is exposed to hydrogen sulfide gas ($H_2S$), and FIG. 6B is an image after the sample of an embodiment is exposed to hydrogen sulfide gas ($H_2S$). FIG. 6C is an image after the sample of an embodiment is heat-treated.

That is, both the comparative sample and the sample of the embodiment include an Ag alloy including the same Ag content. The total content of elements other than Ag may be about 0.5 at %.

It is seen that more agglomeration of the Ag in the alloy including Ag and In occurs in the image of FIG. 5A than the image of FIG. 6A which includes an alloy including Ag, a Group 15 metal element, In, and Zn. Also, in the case where the image of FIG. 5B is compared to the image of FIG. 6B after the exposure to hydrogen sulfide gas ($H_2S$), agglomeration occurs more in the image of FIG. 5B than the image of FIG. 6B. Likewise, in the case where the image of FIG. 5C is compared to the image of FIG. 6C after the heat treatment, agglomeration occurs more in the image of FIG. 5C than the image of FIG. 6C. That is, it is determined that the sample of the embodiment has an excellent flatness as compared to the comparative sample.

That is, the comparative sample and the sample of the embodiment are Ag alloys equally containing 99.5 at % of Ag, but the sample of the embodiment has an excellent flatness by including Group 15 metal elements and the like. Also, it is determined that the sample of the embodiment has excellent sulfurization resistance and heat resistance than the comparative sample.

Figure 7:
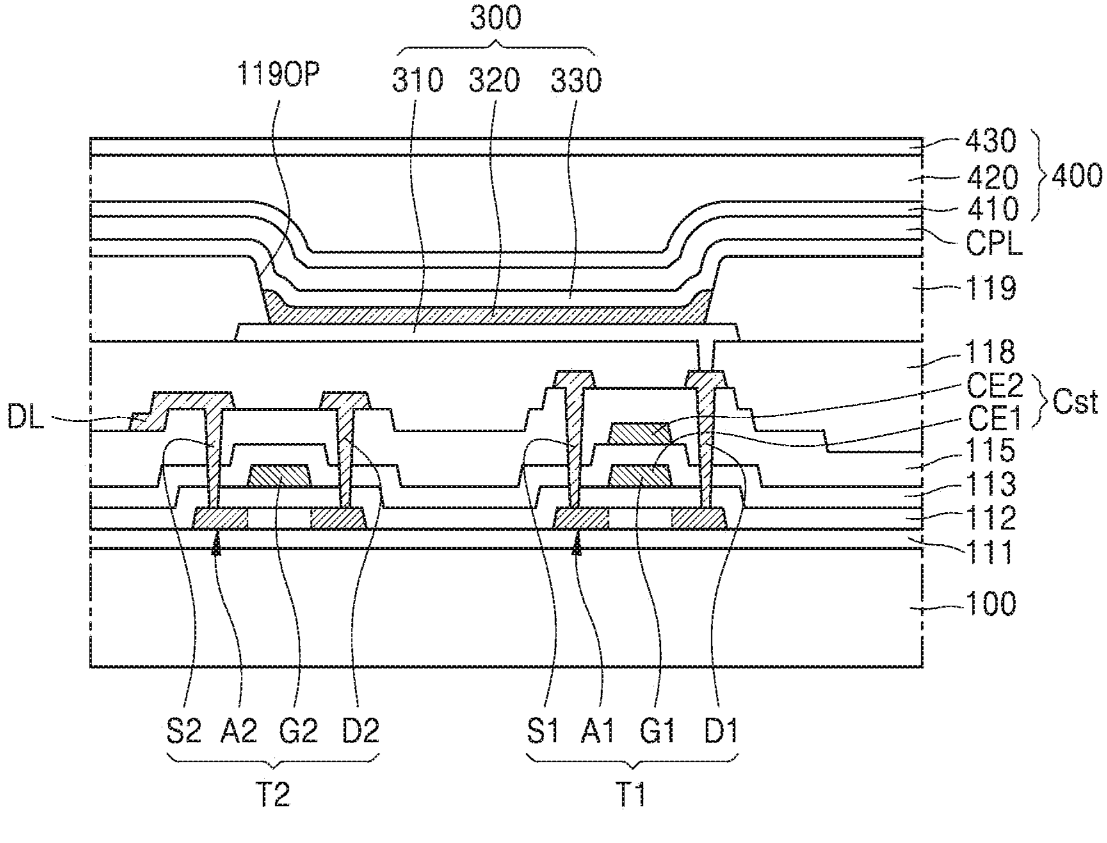
FIG. 7 is a schematic cross-sectional view of a portion of the display apparatus according to an embodiment.

FIG. 7 is a schematic cross-sectional view of a portion of the display apparatus according to an embodiment. Repeated descriptions of the same elements as those of FIG. 3 are omitted.

A capping layer CPL may be disposed on the opposite electrode 330, wherein the capping layer CPL is configured to improve a light efficiency. The capping layer CPL may be a transparent layer. The capping layer CPL may include an organic material, an inorganic material, or a mixture thereof. Examples of an organic material include at least one of tris-8-hydroxyquinoline aluminum ($Alq_3$), ZnSe, 2,5-bis(6'-(2',2"-bipyridyl))-1,1-dimethyl-3,4-diphenylsilole, 4'-bis[N-(1-napthyl)-N-phenyl-amion] biphenyl (α-NPD), N,N'-diphenyl-N,N'-bis(3-methylphenyl)-1,1'-biphenyl-4,4'-diamine (TPD), 1,1'-bis(di-4-tolylaminophenyl) cyclohexane (TAPC), triaryl amine derivative (EL301), 8-quinolinolato Lithium (Liq), N(diphenyl-4-yl)9,9-dimethyl-N-(4(9-phenyl[1]9H-carbazol-3-yl)phenyl)-9H-fluorene-2-amine (HT211), and 2-(4-(9,10-di(naphthalene-2-yl) anthracene-2-yl)phenyl)-1-phenyl-1H-benzo-[D]imidazole (LG201). Examples of an inorganic material include at least one of ITO, IZO, $SiO_2$, $SiN_x$, yttrium oxide ($Y_2O_3$), tungsten trioxide ($WO_3$), and $Al_2O_3$.

A thin-film encapsulation layer 400 may be further disposed on the organic light-emitting diode 300 on the capping layer CPL, wherein the thin-film encapsulation layer 400 is configured to encapsulate the display area DA. The thin-film encapsulation layer 400 may be configured to protect the organic light-emitting diode 300 and the like from external moisture or oxygen by covering the display area DA. The thin-film encapsulation layer 400 includes a first inorganic encapsulation layer 410, an organic encapsulation layer 420, and a second inorganic encapsulation layer 430.

The first inorganic encapsulation layer 410 may cover the opposite electrode 330 and include ceramic, metal oxide, metal nitride, metal carbide, metal oxynitride, indium oxide ($In_2O_3$), tin oxide ($SnO_2$), and indium tin oxide (ITO), silicon oxide, silicon nitride and/or silicon oxynitride or the like. Other layers including the capping layer CPL may be disposed between the first inorganic encapsulation layer 410 and the opposite electrode 330. Because the first inorganic encapsulation layer 410 is formed along a structure thereunder, an upper surface thereof is not flat.

The organic encapsulation layer 420 may cover the first inorganic encapsulation layer 410 and, unlike the first inorganic encapsulation layer 410, the upper surface of the organic encapsulation layer 420 may be approximately flat. Specifically, the upper surface of a portion of the organic encapsulation layer 420 that corresponds to the display area DA may be approximately flat. The organic encapsulation layer 420 may include at least one material among acryl, methacryl, polyester, polyethylene, polypropylene, polyethylene terephthalate (PET), polyethylene naphthalate, polycarbonate, polyimide, polyethylene sulfonate, polyoxymethylene, polyarylate, and hexamethyldisiloxane.

The second inorganic encapsulation layer 430 may cover the organic encapsulation layer 420 and include ceramic, metal oxide, metal nitride, metal carbide, metal oxynitride, indium oxide ($In_2O_3$), tin oxide ($SnO_2$), and indium tin oxide (ITO), silicon oxide, silicon nitride and/or silicon oxynitride or the like. Because the second inorganic encapsulation layer 430 contacts the first inorganic encapsulation layer 410 at the edge outside the display area DA, the organic encapsulation layer 420 may not be exposed to the outside.

Because the thin-film encapsulation layer 400 includes the first inorganic encapsulation layer 410, the organic encapsulation layer 420, and the second inorganic encapsulation layer 430, even when cracks occur inside the thin-film encapsulation layer 400, the cracks may not be propagated through the thin-film encapsulation layer 400, for example, through the first inorganic encapsulation layer 410 and the organic encapsulation layer 420 or through the organic encapsulation layer 420 and the second inorganic encapsulation layer 430 through the above multi-layered structure. With this configuration, a path through which external moisture or oxygen penetrates into the display area DA may be prevented or reduced.

In an embodiment, although it is shown that the thin-film encapsulation layer 400 is used as an encapsulation member encapsulating the organic light-emitting diode 300, the embodiment is not limited thereto. As an example, an encapsulation substrate attached to the substrate 100 using sealant or frit may be used as a member for sealing the organic light-emitting diode 300.

As described above, in an embodiment, the opposite electrode 330 may include an Ag alloy including Ag, a Group 15 metal element, In, and Zn. The total content of Group 15 metal elements may be 0.25 at % or more. The total content of In and/or Zn may be 0.25 at % or more. In the Ag alloy, the content of elements other than Ag may be 1 at % or less. Accordingly, the opposite electrode 330 may have a low resistance and an excellent surface flatness.

According to an embodiment, because the opposite electrode includes an Ag alloy including at least one of Group 15 metal elements, images of an excellent quality may be implemented. However, this effect is an example, and the scope of the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate; and a display element disposed over the substrate, wherein the display element includes:

a pixel electrode, an emission layer disposed on the pixel electrode, and an opposite electrode covering the emission layer, and wherein the opposite electrode includes a silver (Ag) alloy including Ag, at least one of Group 15 metal elements, and an indium (In), wherein the opposite electrode includes a first layer and a second layer disposed on the first layer, and wherein the first layer is metal and the second layer includes the silver (Ag) alloy.

2. The display apparatus of claim 1, wherein Ag content included in the opposite electrode is 99 at % or more.

3. The display apparatus of claim 1, wherein the Group 15 metal element included in the opposite electrode is bismuth (Bi) or antimony (Sb).

4. The display apparatus of claim 1, wherein a total content of the Group 15 metal elements included in the Ag alloy is from about 0.25 at % to about 0.75 at %.

5. The display apparatus of claim 1, wherein the opposite electrode further includes zinc (Zn).

6. The display apparatus of claim 5, wherein a total content of indium (In) and zinc (Zn) included in the Ag alloy is from about 0.25 at % to about 0.75 at %.

7. The display apparatus of claim 1, wherein the first layer includes at least one of ytterbium (Yb), scandium (Sc), vanadium (V), yttrium (Y), indium (In), cerium (Ce), samarium (Sm), europium (Eu), and terbium (Tb).

8. The display apparatus of claim 7, wherein a thickness of the second layer is from about 50 Å to about 200 Å.

9. The display apparatus of claim 8, wherein a thickness of the first layer is from about 5 Å to about 30 Å.

10. The display apparatus of claim 1, wherein a resistivity of the opposite electrode is 7 μΩcm or less.

11. A display apparatus comprising:

a substrate; and a display element disposed over the substrate, wherein the display element includes:

a pixel electrode, a pixel-defining layer including an opening exposing at least a portion of the pixel electrode, and an opposite electrode disposed on the pixel electrode and the pixel-defining layer, wherein the opposite electrode includes a first layer and a second layer disposed on the first layer, and wherein the first layer is metal and the second layer includes a silver (Ag) alloy including Ag, at least one of Group 15 metal elements, indium (In), and zinc (Zn), an Ag content in the Ag alloy being 99 at % or more.

12. The display apparatus of claim 11, wherein the Group 15 metal element included in the second layer is bismuth (Bi) or antimony (Sb).

13. The display apparatus of claim 11, wherein a total content of the Group 15 metal elements included in the second layer is from about 0.25 at % to about 0.75 at %.

14. The display apparatus of claim 11, wherein a total content of indium (In) and zinc (Zn) included in the second layer is from about 0.25 at % to about 0.75 at %.

15. The display apparatus of claim 11, wherein a resistivity of the second layer is 7 μΩcm or less.

16. The display apparatus of claim 11, wherein a thickness of the first layer is from about 5 Å to about 30 Å and a thickness of the second layer is from about 50 Å to about 200 Å.

17. The display apparatus of claim 16, wherein the first layer includes at least one of ytterbium (Yb), scandium (Sc), vanadium (V), yttrium (Y), indium (In), cerium (Ce), samarium (Sm), europium (Eu), and terbium (Tb).

18. The display apparatus of claim 11, further comprising an emission layer disposed between the pixel electrode and the opposite electrode, wherein the emission layer is disposed in the opening of the pixel-defining layer.

19. The display apparatus of claim 11, further comprising a thin-film encapsulation layer disposed on the opposite electrode and including at least one inorganic encapsulation layer and at least one organic encapsulation layer.

* * * * *